(12) United States Patent
Kliuchnikov et al.

(10) Patent No.: US 11,734,596 B2
(45) Date of Patent: Aug. 22, 2023

(54) EDGE-DISJOINT PATHS FOR LONG-RANGE MULTI-QUBIT OPERATIONS IN QUANTUM CIRCUIT

(71) Applicant: Microsoft Technology Licensing, LLC, Redmond, WA (US)

(72) Inventors: Vadym Kliuchnikov, Redmond, WA (US); Eddie Schoute, College Park, MD (US); Alexander Vaschillo, Redmond, WA (US); Dmitry Vasilevsky, Redmond, WA (US); Michael Beverland, Seattle, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 358 days.

(21) Appl. No.: 17/096,313

(22) Filed: Nov. 12, 2020

(65) Prior Publication Data

US 2022/0147856 A1    May 12, 2022

(51) Int. Cl.
*G06N 10/00* (2022.01)
*G06N 10/60* (2022.01)
*G06N 10/70* (2022.01)
*G06F 15/82* (2006.01)
*G06F 30/327* (2020.01)

(52) U.S. Cl.
CPC ............. *G06N 10/00* (2019.01); *G06F 15/82* (2013.01); *G06F 30/327* (2020.01); *G06N 10/60* (2022.01); *G06N 10/70* (2022.01)

(58) Field of Classification Search
CPC ........ G06N 10/60; G06N 10/70; G06N 10/00; G06F 15/82; G06F 30/327

USPC .............................. 706/12; 326/1, 16, 9, 3, 5
See application file for complete search history.

(56) References Cited

U.S. PATENT DOCUMENTS

2014/0250288 A1    9/2014  Roy
2020/0184031 A1    6/2020  Horii

FOREIGN PATENT DOCUMENTS

WO    2018089792 A1    5/2018

OTHER PUBLICATIONS

Gushu et al "Tackling the Qubit Mapping Problem for NISQ-ERA Quantum devices", arXiv:1809.02573v1, arXiv, 13pgs, Sep. 7, 2018.*
Childs, et al., "Circuit Transformations for Quantum Architectures", In Repository of arXiv:1902.09102v1, Feb. 25, 2019, 28 Pages.

(Continued)

*Primary Examiner* — Arnold M Kinkead
(74) *Attorney, Agent, or Firm* — Holzer Patel Drennan

(57) ABSTRACT

A method for performing long-range multi-qubit measurements in a quantum circuit utilizes a graph that maps qubits of the quantum circuit to nodes that are connected to one another by edges. The method provides for identifying sets of the nodes on the graph corresponding to sets of qubits targeted by multi-qubit operations in a quantum algorithm and for defining a group of edge-disjoint paths connecting the nodes of each set. The group of edge-disjoint paths is defined such that no two of the paths in the group share an edge. The method further provides for performing a set of operations to entangle the qubits corresponding to the to the identified set of nodes that are included in each path in the group and for performing the set of multi-qubit operations on the entangled sets of the qubits.

20 Claims, 9 Drawing Sheets

(56) References Cited

OTHER PUBLICATIONS

Itoko, et al., "Quantum Circuit Compilers Using Gate Commutation Rules", In Proceedings of the 24th Asia and South Pacific Design Automation Conference, Jan. 21, 2019, 6 Pages.
Lao, et al., "Timing and Resource-Aware Mapping of Quantum Circuits to Superconducting Processors", In Repository of arXiv:1908.04226v2, Jul. 2, 2020, 15 Pages.
Lukac, et al., "Geometric Refactoring of Quantum and Reversible Circuits: Quantum Layout", In Proceedings of 23rd Euromicro Conference on Digital System Design, Aug. 26, 2020, pp. 428-435.
Nash, et al., "Quantum Circuit Optimizations for NISQ Architectures", In Repository of arXiv:1904.01972v1, Apr. 3, 2019, 9 Pages.
"International Search Repod and Written Opinion Issued in PCT Application No. PCT/US2021/039762", dated Oct. 22, 2021, 14 Pages.
Bapat, et al., "Nearly Optimal Time-Independent Reversal of a Spin Chain", In Repository of https://arxiv.org/abs/2003.02843, Mar. 5, 2020, 7 Pages.
Chuzhoy, et al., "Almost Polynomial Hardness of Node-Disjoint Paths in Grids", In Proceedings of the 50th Annual ACM SIGACT Symposium on Theory of Computing, Jun. 2018, pp. 1220-1233.
Horsman, et al., "Surface Code Quantum Computing by Lattice Surgery", In Proceedings of New Journal of Physics 14, Issue 12, Dec. 2012, 28 Pages.
Kleinberg, Jon M., "Approximation Algorithms for Disjoint Paths Problems", In Proceedings of Doctoral dissertation, Massachusetts Institute of Technology, May 1996, 188 Pages.
Kleinberg, et al., "Disjoint Paths in Densely Embedded Graphs", In Proceedings of IEEE 36th Annual Foundations of Computer Science, Oct. 1995, pp. 52-61.
Litinski, Daniel, "A Game of Surface Codes: Large-Scale Quantum Computing with Lattice Surgery", In Journal of Quantum, vol. 3, Mar. 5, 2019, 37 Pages.

\* cited by examiner

NOT an Edge Disjoint Path Set

Edge-Disjoint Path Set

Second stage.

— Path A
– – Path B
• • • Path C

Second stage. Joint measurements 1.

Second stage. Joint measurements 2.

EDGE-DISJOINT PATHS FOR LONG-RANGE MULTI-QUBIT OPERATIONS IN QUANTUM CIRCUIT

BACKGROUND

A number of quantum error correction codes (QECCs) have been developed to protect quantum states from noise during measurement. In any QECC, logical qubits are encoded using several physical qubits to enable fault tolerant quantum computations. The logical qubit may be understood as having redundant data spread out over many data qubits in order to provide better measurement accuracy.

The surface code is one promising QECC that provides for encoding logical qubits on a form of entangled 2D lattice (e.g., a square grid) that includes many qubits. The lattice is divided into many plaquettes, and the state of the lattice is maintained by repeatedly measuring sets of stabilizers. For example, a stabilizer is measured by entangling together qubits on an individual plaquette of the grid and measuring the resulting state. This entanglement forces the qubits into an eigenstate of a stabilizer operator (e.g., the X-stabilizer or the Z-stabilizer), allowing one to measure the stabilizers without perturbing the system. When the stabilizer measurement outcomes change within the surface code, this corresponds to one or more qubit errors in the quantum state that is projected by the measurement.

One constraint of the surface code is that error correction of the logical qubits depends upon interactions between nearest-neighbor qubits. Consequently, quantum circuits utilizing surface code are generally designed to provide error correction for groups of tightly-localized qubits. Additionally, high-level quantum algorithms may request operations that are not compatible with these those used in circuits employing surface code. Therefore, algorithm designers are tasked with a problem known as quantum circuit synthesis—e.g., how to approximate operations of a quantum algorithm using operations that are compatible with a given quantum circuit layout.

Traditional quantum circuits implementing surface code restrict the available set of quantum operations for implementing high-level algorithms. In general, these circuits limit the available set of multi-qubit operations to those performed on qubits that are physically in very close proximity (e.g., nearest neighbor qubits). In some circuits implementing surface code, measurements between non-neighboring qubits may be performed by using "SWAP" operations to physically transport quantum states between qubits. However, these solutions typically entail a large number of measurement steps, which increases the time it takes to implement a given solution.

SUMMARY

According to one implementation, a method for performing parallel long-range multi-qubit operations in a quantum circuit entails defining a graph of nodes mapped to the qubits, the nodes of the graph being connected by edges. The method further provides for identifying sets of nodes on the graph corresponding to sets of qubits targeted by multi-qubit operations in a quantum algorithm, and for defining a group of edge-disjoint paths connecting the qubits of each of the sets. The disjoint paths are defined such that no two of the paths in the group share an edge. The method further provides for performing a set of operations to entangle the qubits corresponding to the identified set of nodes that are included in each of the defined edge-disjoint paths and for performing the set of multi-qubit operations on the entangled sets of the qubits.

DETAILED DESCRIPTION

The herein disclosed technology facilitates efficient long-range multi-qubit operations within quantum circuits adapted to implement surface code. Rather than utilize SWAP operations, the disclosed approach provides for parallelized, long-range teleportation (e.g., entangling strings of nearest-neighbor qubits) in a manner that maximizes a possible number of simultaneous long-range multi-qubit joint operations. This approach reduces the total number of measurement operations necessary to implement complex multi-qubit operations on a quantum circuit executing surface code.

According to one implementation, the disclosed approach provides for identifying sets of edge-disjoint paths on a surface code graph defined by nodes and edges, where the nodes represent qubits on a quantum circuit and the edges represent connections between nearest-neighbor qubits. The edge-disjoint paths identified are used to entangle strings of qubits in a manner that facilitates long-range multi-qubit operations. As used herein, two or more paths are referred to as "edge-disjoint paths" when there is no "edge" that is shared between the paths. Notably, two or more paths may be still considered "edge-disjoint paths" if they intersect a same node but do not share an edge. These paths are referred to herein as shared-node edge-disjoint paths.

The herein proposed methodology provides for special consideration and handling of edge-disjoint paths that share nodes with one another (e.g., intersect). The disclosed methodology provides for segmentation of an edge-disjoint path that shares a node with another edge-disjoint path. After the path is split into different segments, entanglement operations are performed to entangle the qubits of each segment. The entanglement operations with respect to different segments of a same edge-disjoint path are non-concurrent to one another (performed at different points in time). This methodology may be realized more fully with respect to the following figures.

Figure 1:
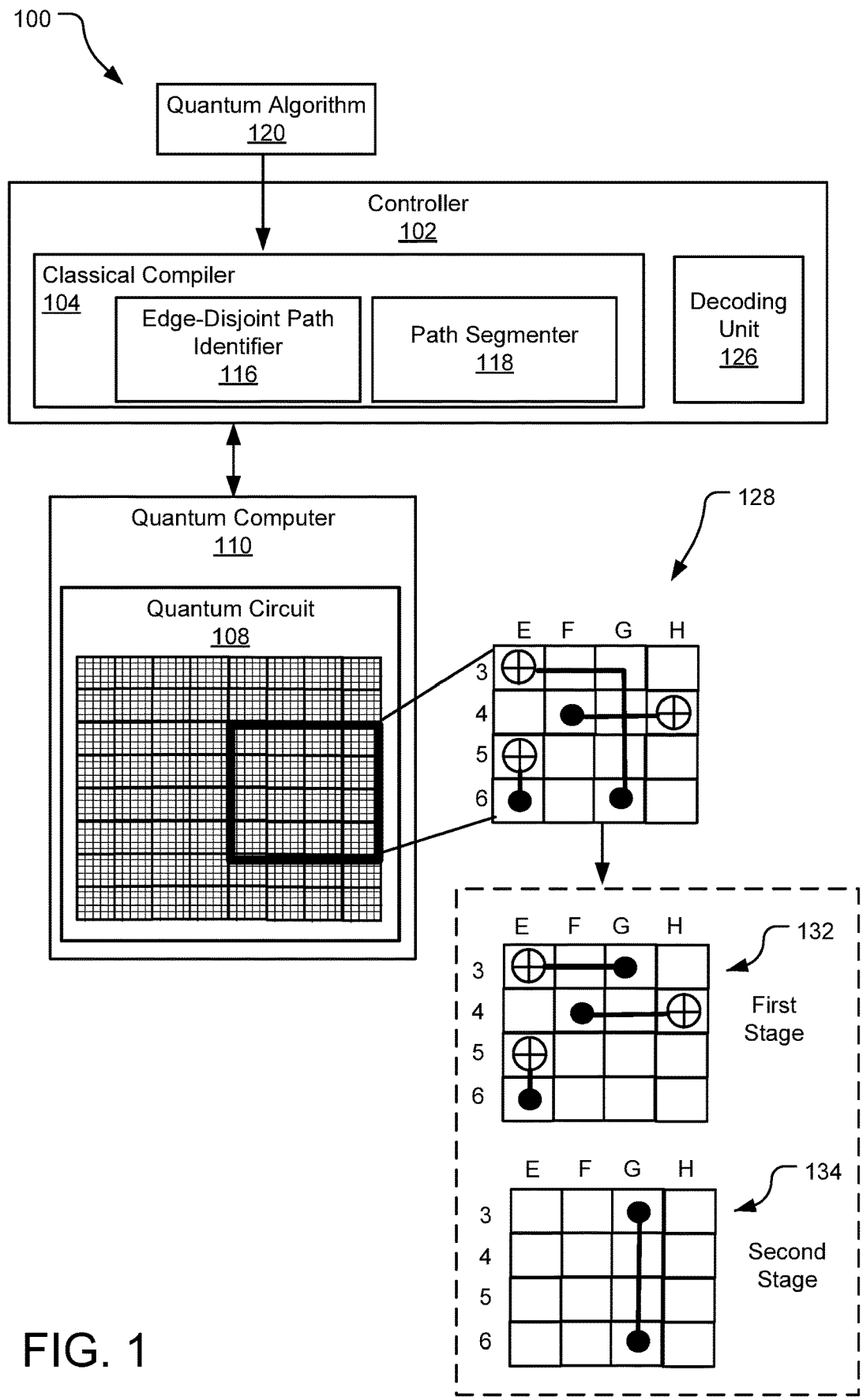
FIG. 1 illustrates an example quantum computing system that utilizes edge-disjoint paths to perform long-range multi-qubit operations.

FIG. 1 illustrates an example quantum computing system 100 that includes a controller 102, which may understood as including classical software and/or hardware elements. The controller 102 includes a classical compiler 104 that performs compilation operations to prepare instructions implementable on a quantum computer 110 to implement operations of a quantum algorithm 120. The classical compiler 104 is shown including two sub-modules—an edge-disjoint path identifier 116 and a path segmenter 118. The edge-disjoint path identifier 116 and path segmenter 118 perform actions to map the quantum operations of the quantum algorithm 120 to quantum operations that are physically available for implementation on a quantum circuit 108 that implements a surface code architecture for error correction.

The quantum circuit 108 is, in FIG. 1, depicted as a grid of squares (e.g., a qubit register) included within the quantum computer 110. Although the quantum circuit 108 is shown to be a 2D grid, some implementations may include 3D grid configurations. Each illustrated square (e.g., a square 112) within the quantum circuit 108 may be understood as representing one logical qubit that is itself comprised of many data qubits storing the data of the logical qubit. The data qubits within each logical qubit implement surface code to detect and correct errors.

When provided with the quantum algorithm 120, the classical compiler 104 performs operations to map high level quantum operations (target unitaries) to physical qubit operations that can be performed on the quantum circuit 108. Due to the surface code architecture embedded within each logical qubit, the set of operations available for implementation by the quantum circuit 108 may exclude one or more operations specified by the quantum algorithm 120. Specifically, quantum circuits implementing surface code typically limit joint operations (e.g., 2-qubit or 3-qubit measurements) to joint operations that target sets of qubits that happen to be connected together through a line of nearest neighbor qubits. Although the square grid of FIG. 1 seemingly provides for connectivity between any two qubits on the grid through such a line, complications arise when a quantum algorithm requests multiple parallel (simultaneous) long-range multi-qubit operations.

As used herein, "long-range" refers to an operation between two qubits that are not nearest neighbors. In the quantum circuit 108, two logical qubits are said to be "nearest neighbors" when they are directly adjacent and share an edge boundary (e.g., directly adjacent vertical or directly adjacent horizontal qubits).

To address the foregoing challenges relating to parallel (simultaneous) multi-qubit operations, the edge-disjoint path identifier 116 identifies a set of edge-disjoint paths within the quantum circuit 108 that provide connectivity between all sets of qubits targeted by the parallel multi-qubit operations. As described below, these identified edge-disjoint paths are used to establish entanglements between each set of qubits targeted by one of the multi-qubit operations.

By example and without limitation, expanded view 128 illustrates a portion of the quantum circuit 108 containing qubits that are targeted by a collection of parallel multi-qubit operations specified by the quantum algorithm 120. In the illustrated example, the quantum algorithm 120 provides for three simultaneous CNOT operations: a first CNOT acts on qubits E3 and G6; a second CNOT acts on qubits F4 and H4; and a third CNOT that acts on qubits E5 and E6. In order to map the specified operations to operations that can be physically implemented on the quantum circuit 108, the edge-disjoint path identifier 116 identifies a group of edge-disjoint paths that each provide connectivity between the qubits of one of the requested parallel multi-qubit operations. The identified edge-disjoint paths (shown on the grid in view 128) correspond to lines of qubits that are to be used to implement the requested parallel multi-qubit measurements.

Figure 2:
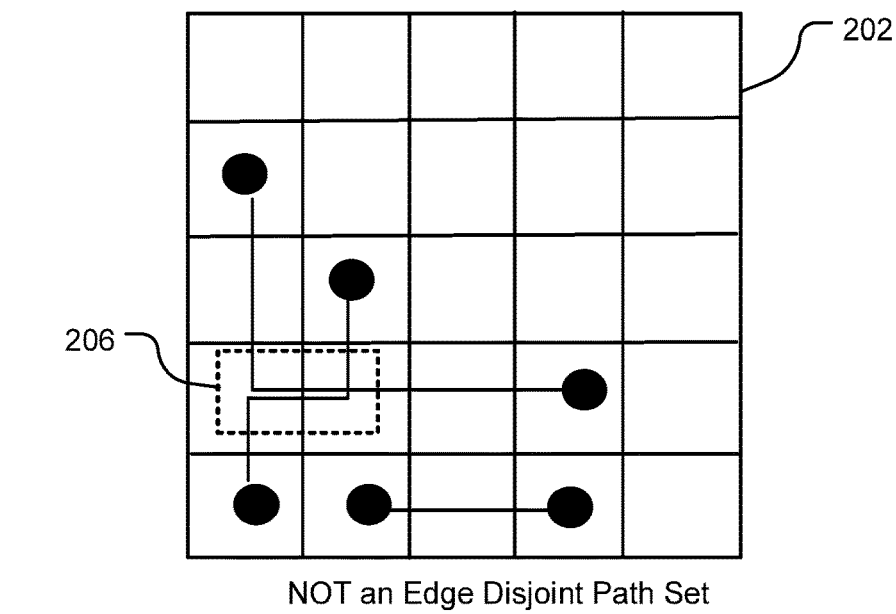
FIG. 2 illustrates examples of paths on a quantum circuit that are and are not considered edge-disjoint paths.
Figure 2:
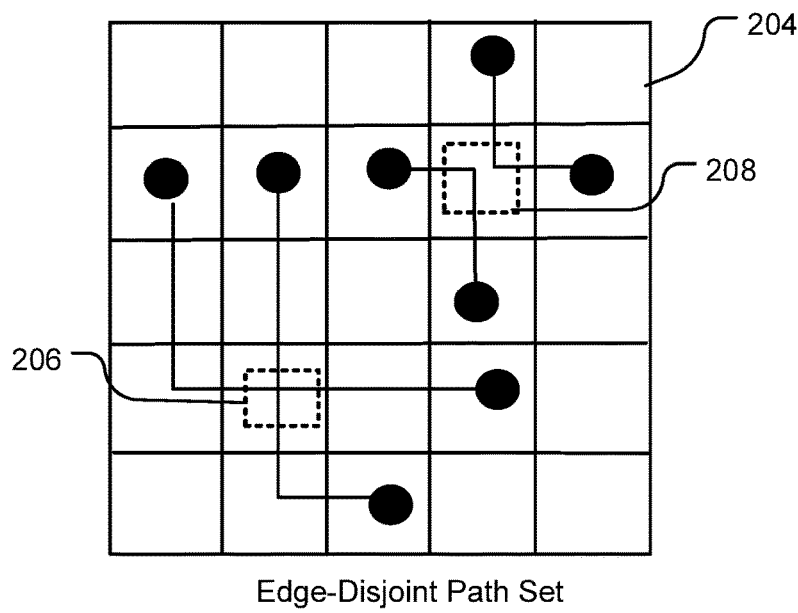

As previously mentioned, two paths are said to be edge-disjoint paths if the paths do not share an edge (e.g., cross a common boundary between nodes). In the illustrated example, the path connecting E3→G6 intersects the path connecting H4→F4. This intersection occurs at a node (G4). Thus, these two paths share a node but do not share an edge. Therefore, these two paths, along with the path connecting EF→E6, comprise a group of edge-disjoint paths. For further context on the meaning of "edge-disjoint paths," FIG. 2 illustrates further examples of node sharing (permissible) v. edge sharing (not permissible).

Notably, the three exemplary edge-disjoint paths shown in FIG. 1 each correspond to a different 2-qubit measurement targeting qubits that correspond to the endpoints of the path. However, similar methodology may be used to identify edge-disjoint paths between sets of three or more qubits. For example, three qubits may be connected by a tree-like structure with three endpoints (a "T-shaped" path or any other continuous path with three endpoints). Regardless of implementation, however, the paths associated with a requested set of parallel multi-qubit operations is a group of edge-disjoint paths selected such that no edges are shared between the independent paths in the group.

Referring again to the illustrated example, it is possible to perform a joint measurement on any two qubits in the quantum circuit 108 by entangling the two qubits with one another through interactions of nearest-neighbor qubits. For example, a joint measurement on F4 and H4 may be performed by entangling the target qubits F4 and H4 with the line of qubits extending between them; specifically, this can be achieved by entangling F4, G4, and H4 and then by performing a joint measurement on F4 and H4.

Traditionally, challenges arise when there exist intersections (e.g., one or more shared nodes) between the edge-disjoint paths used to implement parallel multi-qubit operations. If, for example, entanglement operations are simultaneously performed with respect to the path E3→G6 and the path H4→F4, all four endpoints (E3, G6, H4, and F4) wind up entangled together, thereby prohibiting independent measurements of the pairs [E3, G6] and [H4, F4]. To avoid this pitfall, the path segmenter 118 identifies and implements break-points within the group of identified edge-disjoint paths operations to eliminate the path intersections by segmenting one or both paths into different portions. This path segmentation defines path segments that are used in different "stages" of entanglement operations. For example, each different stage of entanglement operation is implemented at separated point in time to ensure that target qubits of the long-range interactions (e.g., E3, E6) do not end up entangled with target qubits of other, parallel long-range interactions (e.g., E4, H4).

For example, in FIG. 1, the path segmenter 118 identifies all intersections that occurs within the group of edge-disjoint paths shown in view 128. In this example, there is only one intersection (at G4) where two paths share a node. The path segmenter 118 parses the path originally extending from E3 to G6 into two separate segments, thereby forming a first segment extending from E3 to G3 and a second segment extending from G3 to G6. The path segmenter 118 assigns the first segment (E3→G3) to a first operational stage 132 that also includes the other two paths, H4→F4 and E5→E6. Notably, none of the paths within the first operational stage 132 share a node. The remaining segment (G3→G6) is assigned to a second operational stage 134. The first operational stage 132 defines a first set of entanglement operations that are performed during a first time interval (e.g., concurrent or consecutive to one another) and the second operational stage 134 defines a second set of entanglement operations that are performed during a second, later time interval. In this example, E3, F3, and G3 are entangled with one another during the first time interval corresponding to the first stage, and G3, G4, G5, and G6 are entangled with one another during the second time interval corresponding to the second stage. At the conclusion of the two stages, each set of qubits targeted by one of the parallel multi-qubit operations is entangled so as to facilitate the corresponding multi-qubit measurement. For example, E3 is entangled with G6 and F4 is engaged with H4 but there is no entanglement between the respective pairs [E3, G6] and [F4, H4].

FIG. 2 illustrates further examples 200 of paths on a quantum circuit that are and are not considered edge-disjoint paths for purposes of this disclosure. Like the graphs of FIG. 1, the nodes (squares) on the graph are intended to correspond to physical positions of qubits within a circuit. Boundaries between nodes are referred to as edges. A first example 202 illustrates two paths that share an edge in a region 206. Due to this shared edge, the two paths that intersect in the region 206 cannot be considered edge-disjoint paths. In contrast, a second example 204 illustrates paths that share nodes but not edges. Specifically, regions 206 and 208 each indicate nodes that are shared between two different paths. Due to the absence of shared edges, all paths illustrated in the example 204 are considered to be edge-disjoint paths.

Figure 3:
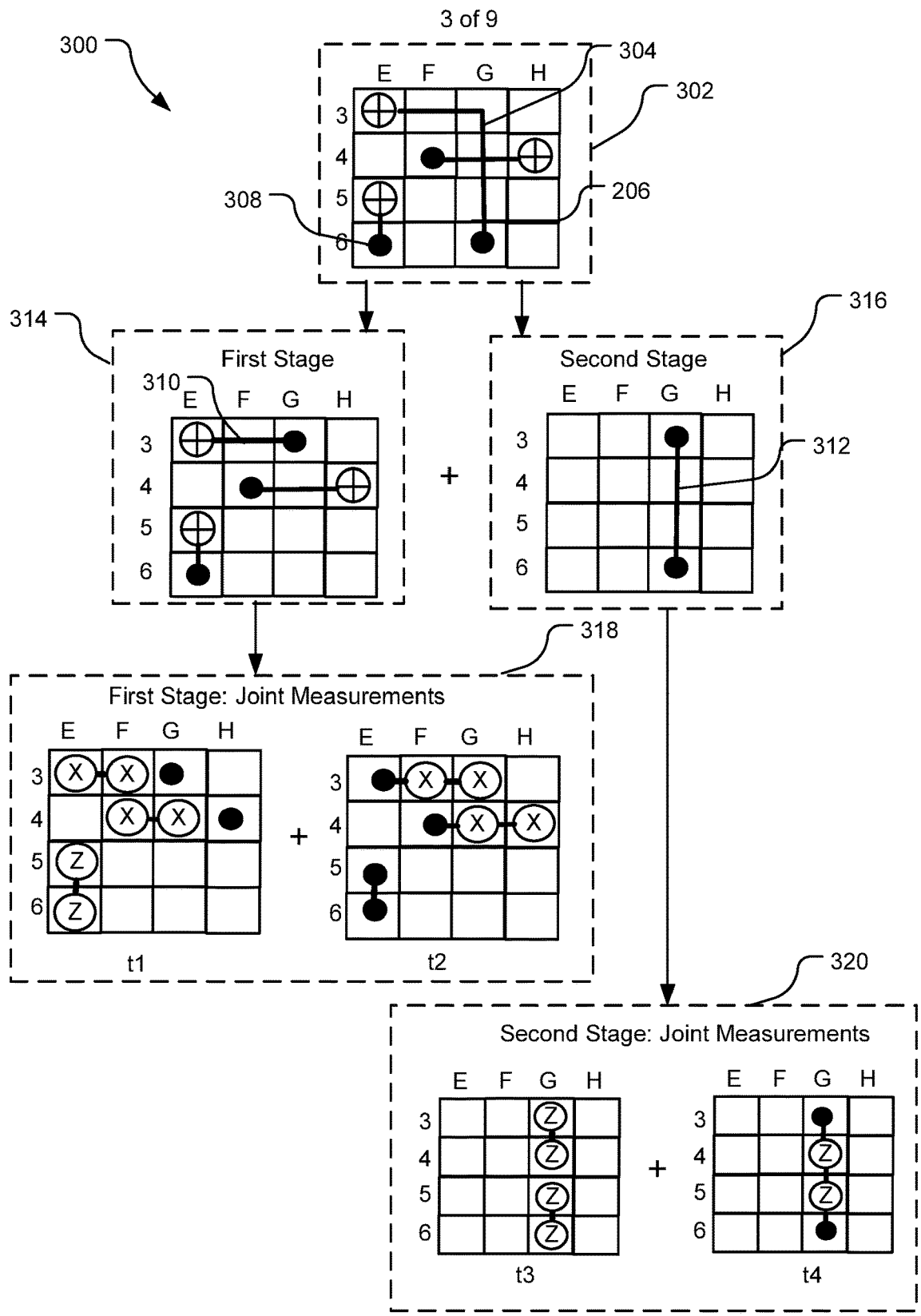
FIG. 3 illustrates example operations for implementing parallel long-range multi-qubit operations using edge-disjoint paths in a quantum circuit implementing a surface code architecture.

FIG. 3 illustrates example operations 300 for implementing parallel long-range multi-qubit operations using edge-disjoint paths in a quantum circuit implementing a surface code architecture. Conventionally, a two-qubit quantum operation is performed by creating a Bell pair, which is achieved through the use of a path of ancilla qubits between the target qubits. The herein disclosed approach achieves the same by identifying suitable sets of edge-disjoint paths and segmenting paths into multi-stage entanglement operations in a manner that ensures constant overhead.

The operations 300 expand on the example shown in FIG. 1. A first view 302 illustrates an exemplary set of edge-disjoint paths 304, 306, and 308 that have been identified as usable to implement trio of 2-qubit quantum operations. Upon determining that paths 304 and 306 share a node (G4), segmentation operations are performed as described with respect to FIG. 1. This segmentation breaks the path 304 into a first segment 310 and a second segment 312. The first segment 310 is assigned to a first operational stage 314 along with the paths 304 and 306 (collectively referred to below as the "first stage paths"), while the second segment 312 is assigned to a second operational stage 316. No two paths or path segments within the first operational stage 314 share a node, and no two paths or path segments in the second operational stage 316 share a node. Through the above methodology, the individual endpoints of the edge-disjoint paths are targeted by either the first stage operations or the second stage operations; however, these endpoints may not be targeted by operations of both the first operational stage 314 and the second operational stage 316.

To implement the first operational stage 314, operations are performed to entangle the qubits respectively arranged along each of the first stage paths. For example, entanglement operations of the first operational phase 314 effect independent entanglement of a first qubit group corresponding to nodes E3, F3, G3, a second qubit group corresponding to nodes F4, G4, and H4 and a third qubit group corresponding to nodes E5 and E6. This entanglement of the "first stage" paths is achieved by way of two rounds of joint measurements 318, which are shown as being performed at times t1 and t2 respectively. Even and odd edges are identified with respect to each of the first stage paths.

In the first measurement round of the first stage (at t1), joint measurements are performed on qubits that connect odd-numbered edges within each of the 3 paths. Here, X-basis joint parity measurements are performed to entangle qubits on horizonal edges (e.g., E3, E4 and F4, G4) while Z-basis joint parity measurements are performed to entangle qubits on vertical edges (e.g., E5, E6). In the second measurement round of the first operational stage (at t2), joint measurements are performed on qubits that connect event-numbered edges within each of the 3 paths. Again, X-basis joint measurements may be performed to entangle qubits on horizonal edges (e.g., F3, G3 and G4, H4) while Z-basis joint measurements may be performed to entangle qubits on vertical edges (e.g., none in the illustrated example).

To implement the second operational stage 316, operations are performed to entangle the qubits respectively arranged along each of the second stage paths. For example, entanglement operations of the first operational stage 314 effect independent entanglement of a qubit group G3, G4, G5, and G6. This entanglement is achieved by way of two rounds of joint measurements 320, performed at times t3 and t4 respectively, where t3 and t4 occur later in time than t1 and t2. In the first measurement round of the second operational stage (at t3), joint measurements are performed on qubits sharing odd-numbered edges. Here, a first Z-basis joint measurement is performed with respect to G3 and G4 and a second Z-basis joint measurement is performed with respect to G5 and G6. During the second measurement round of the second operational stage (at t4) joint measurements are performed on qubits sharing even-numbered edges. Here, another Z-basis joint measurement is performed with respect to nodes G4 and G5.

The above measurement operations complete entanglement of each pair of endpoints on the three edge-disjoint paths shown in view 302. Consequently, joint measurements of the corresponding qubits can now be performed.

Figure 4A:
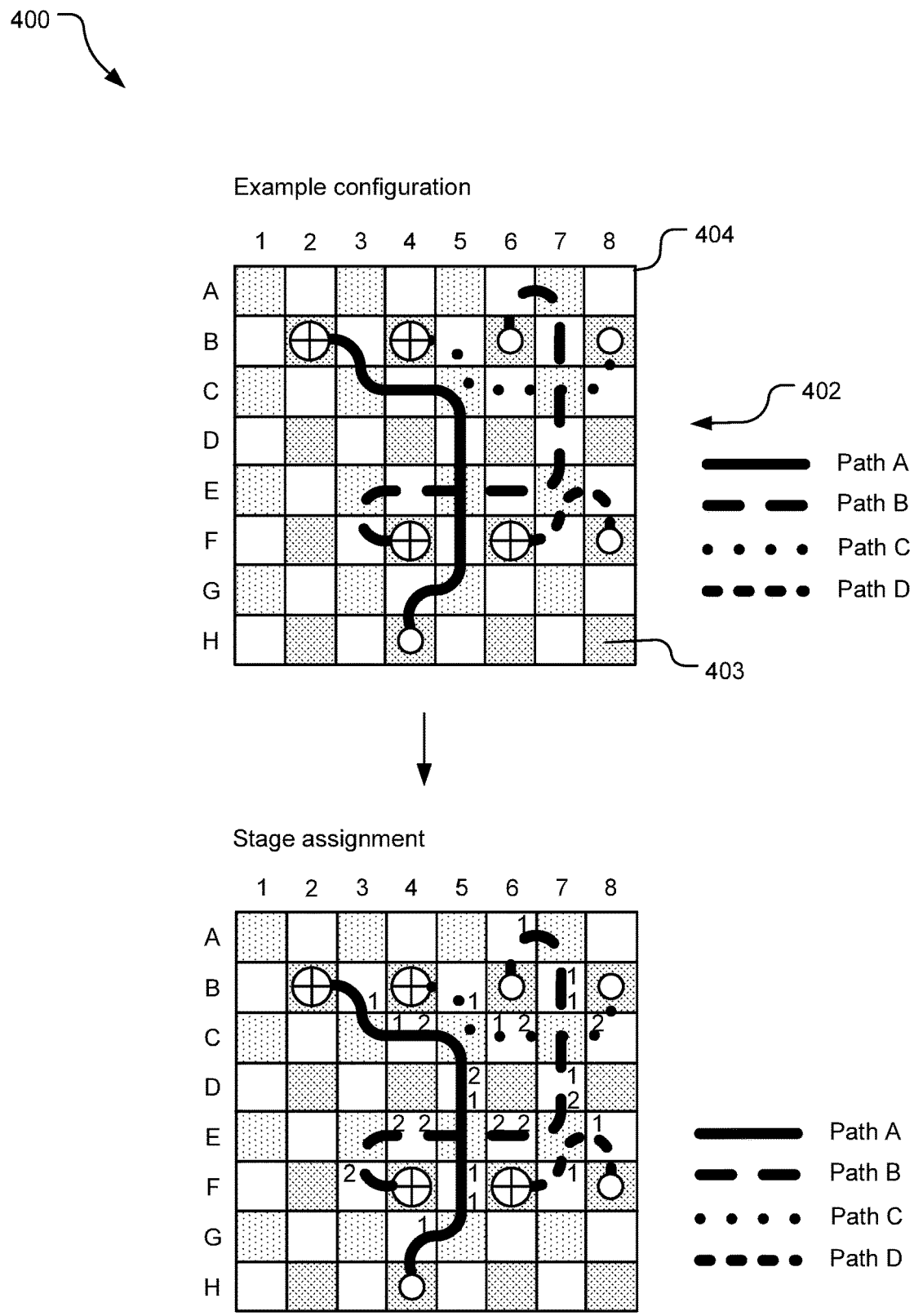
FIG. 4A illustrates exemplary operations to segment edge-disjoint paths according to a methodology that maximizes a number of long-range multi-qubit operations that can be performed in parallel in a quantum circuit.

FIG. 4A illustrates exemplary operations 400 to segment edge-disjoint paths according to a methodology that maximizes a number of long-range joint operations that can be performed in parallel in a quantum circuit. Specifically, FIG. 4A illustrates various operations, shown with respect to views 402 and 406 of a graph 404. The graph 404 includes square nodes that correspond to physical locations of qubits in the quantum circuit. By example and without limitation, all square nodes in the graph 404 may be understood as representing logical qubits with data spread out across a number of embedded data qubits internal to each square node (not shown). In the illustrated operations, the darkest-shaded nodes may be understood as representing data qubits targeted by a quantum algorithm (e.g., a data qubit 403) while light-shaded nodes and unshaded (white) nodes may be understood as representing ancilla qubits that facilitate joint measurements of sets (e.g., two or more of) the data qubits. By design, each pair of directly-adjacent data qubits (black nodes) in the graph 404 is separated by an unshaded (white) node corresponding to an ancilla qubit. Gaps remaining between the unshaded (white) nodes are filled by light-shaded nodes.

View 402 illustrates a group of edge-disjoint paths that have been identified as usable to implement a set of requested multi-qubit operations on the data qubits. This group of edge-disjoint paths includes nodes that are shared between pairs of paths. Specifically, node C7 is shared by paths B and C; node C5 is shared by path A and C; node E5 is shared by path A and B; and node E7 is shared by paths B and D. Due to the geometrical constraints of the graph 404, all shared nodes correspond to gray nodes rather than unshaded nodes.

View 406 illustrates an exemplary algorithmic operation performed to select breakpoints in one or more of the paths. Here, a stage number (1 or 2) is assigned to each path whenever the path crosses a boundary of a gray node. These boundaries of gray nodes are referred to below as "gray node boundaries." This stage number assignment is generated according to two rules. First, any time a path crosses through a gray node, the two resulting gray node boundaries are assigned a same stage number (e.g., either a 1 or 2). Second, if first and second paths pass through a same gray node (e.g., the node is shared between the two paths), the gray node boundaries of the first path are to be assigned a stage number that is different than the gray node boundaries of the second path.

Figure 4B:
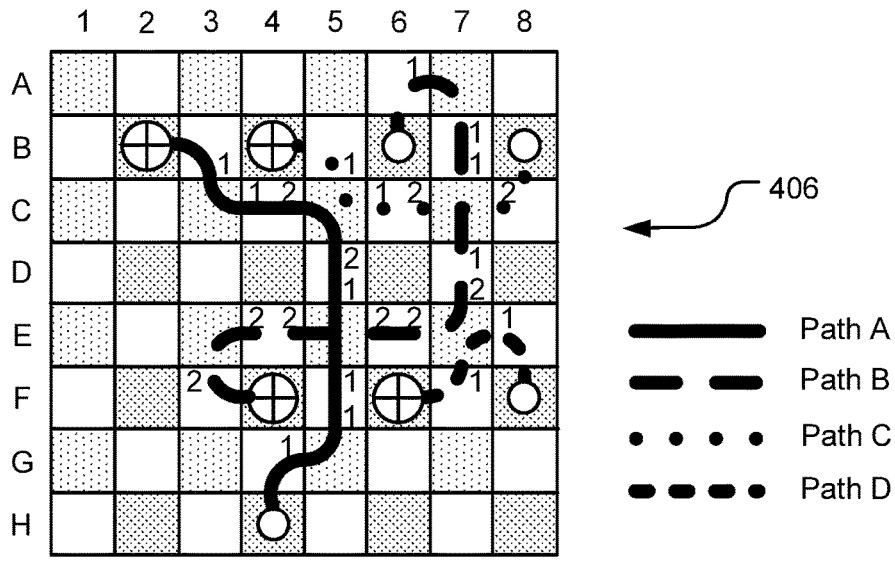
FIG. 4B illustrates an exemplary segmentation of the edge-disjoint paths of FIG. 4A into first and second stage path segments.
Figure 4B:
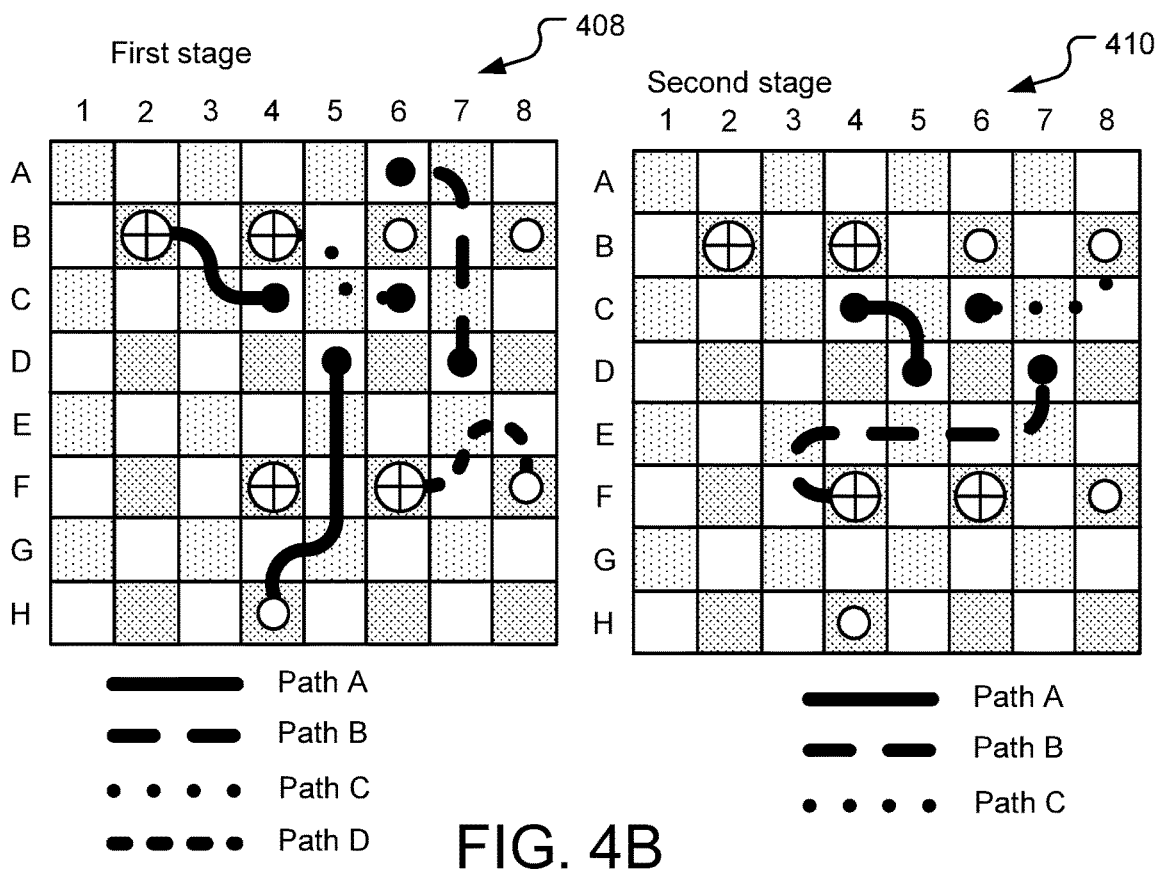

FIG. 4B illustrates operations for segmenting one or more of the identified edge-disjoint paths of FIG. 4A based on their assigned stage numbers. For reference, FIG. 4B again illustrates the view 406 that includes the labeling of stage number assignments for each gray boundary crossing, where the stage number assignments may be determined described above with respect to FIG. 4A. Following the assignment of stage numbers, break points are next identified and implemented as shown in view 408 and 410.

To implement break points, the system identifies path crossings through unshaded nodes where the boundaries of the node are assigned to different stage numbers. For example, nodes C4, C6, D6, and D7 all correspond to unshaded nodes where the associated path boundaries have been assigned different stage numbers. A break point is inserted in each of these nodes, effectively splitting the associated path into two different segments. In this example, Path A is broken into three segments (two assigned to Stage 1 and two assigned to stage 2), while and Paths B and C are broken into two segments (one assigned to Stage 1 and the other assigned to Stage 2).

In the illustrated example, the path portions associated with stage number 1 are assigned to a first operational stage, shown in the view 408, and the path portions associated with stage number 2 are assigned to a second operational stage, shown in the view 410. No two paths or path segments within the first operational stage share a node, and no two paths or path segments in the second operational stage share a node. Through the above methodology, the individual endpoints of each of the edge-disjoint paths are associated with either the first stage operations or the second stage operations, but not both.

Following the illustrated path segmentation, a first stage of entanglement operations is defined with respect to the paths assigned to the first operational stage. Likewise, a second stage of entanglement operations is defined with respect to the paths assigned to the second operational stage. When actually implemented at a quantum circuit, the first stage of entanglement operations is performed non-concurrent to (e.g., before) the second stage of entanglement operations.

Figure 4C:
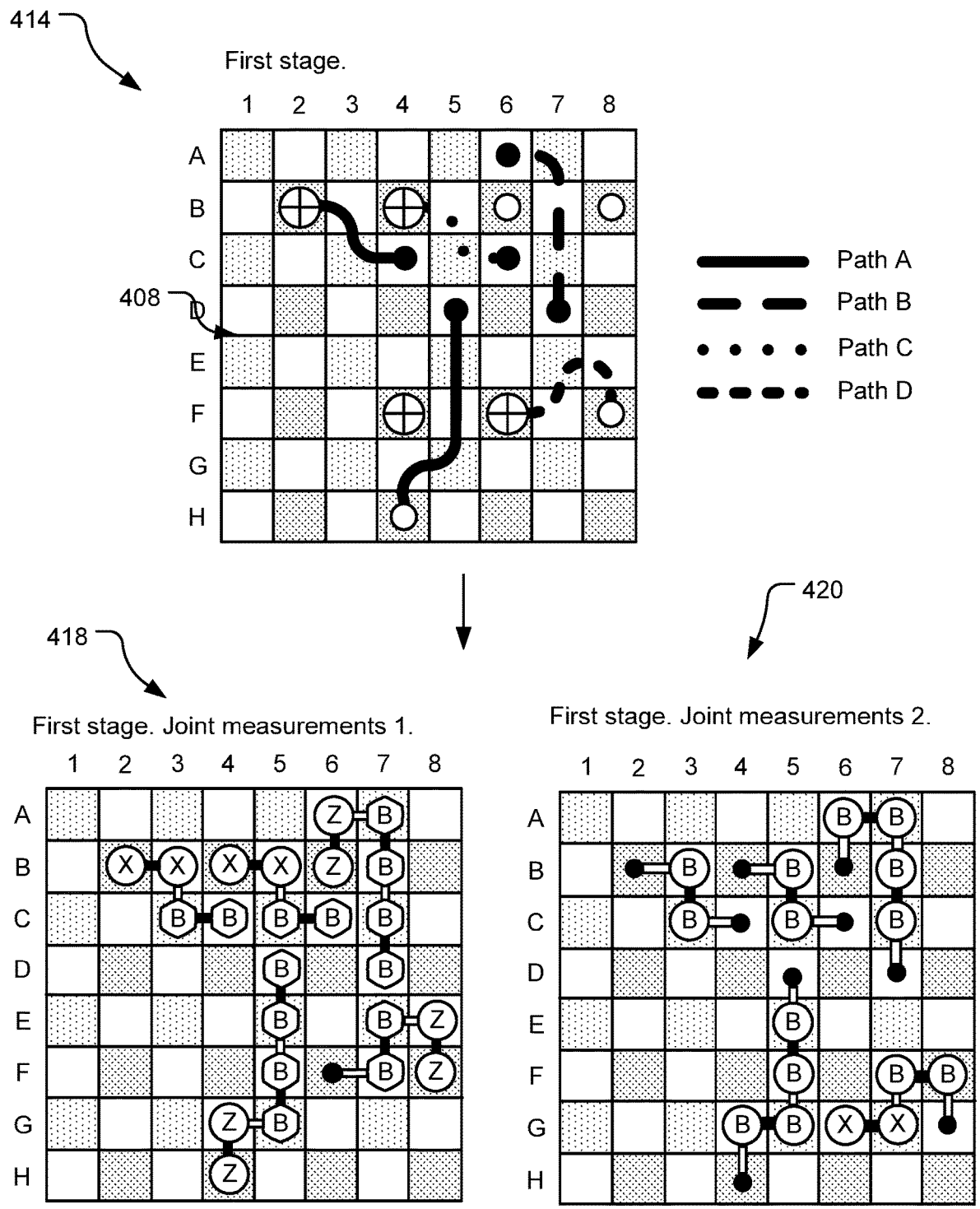
FIG. 4C illustrates circuits for entangling qubits corresponding to the first stage path segments shown in FIG. 4B.
Figure 4D:
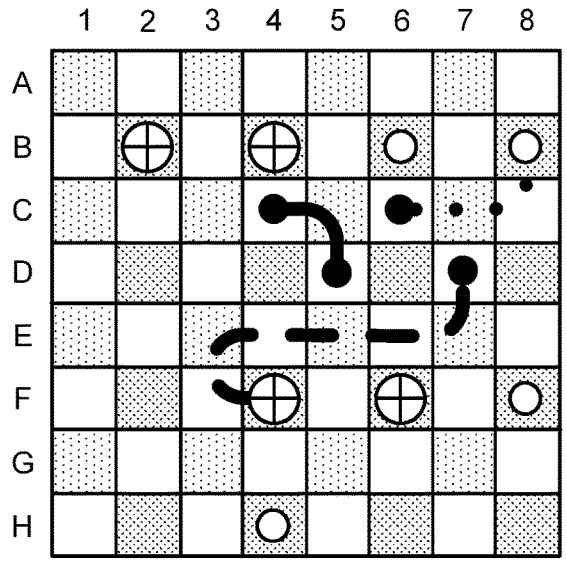
FIG. 4D illustrates circuits for entangling qubits corresponding to the second stage path segments shown in FIG. 4B.
Figure 4D:
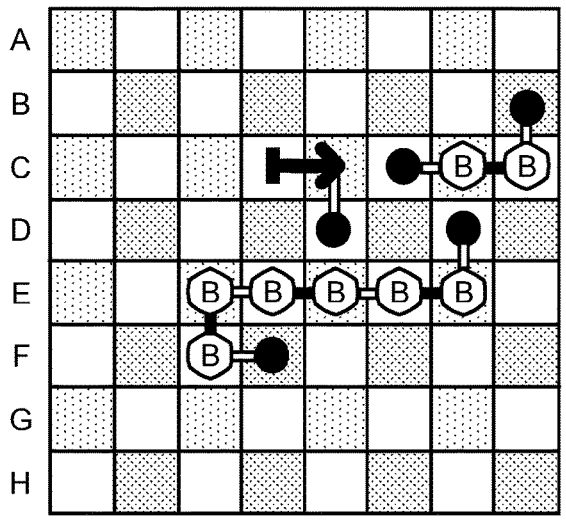
Figure 4D:
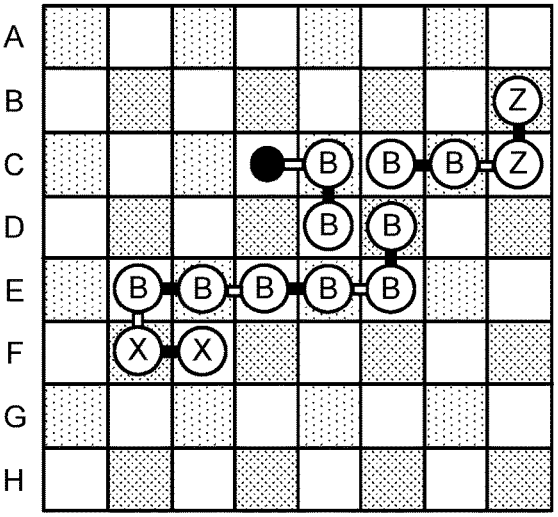

FIG. 4C and FIG. 4D illustrate a translation of the first and second stage paths into actual circuits implementable to entangle the qubits associated with each of the edge-disjoint paths identified in FIG. 4A.

Within FIG. 4C, a first view 416 illustrates the paths associated with stage number 1 ("first stage paths"), as previously shown in view 408 and derived as described above. Views 418 and 420 of FIG. 4C illustrates circuits, implemented in different measurement rounds, that are usable to achieve entanglement of the qubits corresponding to each path. Specifically, view 418 illustrates a first round of first stage measurements and view 420 illustrates a second round of first stage measurements. Although the two rounds of first stage measurements are performed at different times, the measurements performed within each respective round (e.g., those shown within view 418 or view 420) may be performed concurrently. In both of views 418 and 420, solid edges are used to indicate pairs of nodes being jointly measured in the associated step. For example, the edge connecting B2 and B3 in view 418 is solid to indicate a joint measurement of nodes corresponding to B2 and B3. In contrast, hollow edges are used to indicate pairs of nodes that are not subjected to joint measurement in the associated step. For example, the edge connecting B3 to C3 in view 418 is hollow to indicate that the endpoint nodes are not subject to joint measurement in this step.

In the first round of measurements shown with respect to the view 418, even and odd edges are identified with respect to each path and joint measurements are performed on qubits that connect odd-numbered edges within each of the paths. Here, X-basis measurements are performed when the measurement involves a data qubit (black node) and an ancilla qubit connected along a horizontally-oriented odd-numbered edge. Likewise, Z-basis measurements are performed when measurement involves a data qubit and an ancilla qubit connected along a vertically-oriented odd-numbered edge. The letter "B" is used to denote a Bell Measurement.

In the second round of first stage measurements shown with respect to the view 420, joint measurements are performed on qubits that connect even-numbered edges within each of the paths. The measurement type is the same as shown in view 418 (e.g., X-basis measurements are performed with respect to horizonal edges involving a data qubit, Y-basis measurements are performed with respect to vertical edges involving a data qubit, and B-basis measurements are performed with respect to measurements involving two ancilla qubits). At the conclusion of the first and second rounds of first stage joint measurements, the endpoints of each first stage path (e.g., the paths shown in view 408) are entangled with one another.

FIG. 4D illustrates second stage entanglement operations 422 that are an extension of the operations 400, 412, and 414 discussed with respect to FIG. 4A-4C. Within FIG. 4D, a first view 424 illustrates the paths associated with stage number 2 ("second stage paths"), as previously shown in view 410 and derived as described above. Views 426 and 428 illustrates circuits, implemented in different measurement rounds of the second stage, that are usable to achieve entanglement of the qubits corresponding to each path shown in view 408. Specifically, view 426 illustrates a first round of second stage measurements and view 428 illustrates a second round of second stage measurements. Although the two rounds of second stage measurements are performed at different times, the measurements performed within each respective round (e.g., shown within view 426 or 428) may be performed concurrently.

In the first round of joint measurements shown with respect to the view 426, even and odd edges are identified with respect to each path, and joint measurements are performed on qubits that connect odd-numbered edges. The same measurement notation is used in FIG. 4D as described with respect to FIG. 4C.

In the second round of joint measurements shown with respect to the view 428, joint measurements are performed on qubits that connect even-numbered edges within each of the paths. At the conclusion of the first and second rounds of first stage joint measurements, the endpoints of each of the initially-identified edge-disjoint paths (e.g., the paths shown in view 410 of FIG. 4A) are entangled with one another. At this point in time, joint measurements can be implemented on the sets of qubits targeted by the multi-qubit operations of the quantum algorithm (e.g., the endpoints of each of the edge-disjoint paths shown within view 402 of FIG. 4A).

Figure 5:
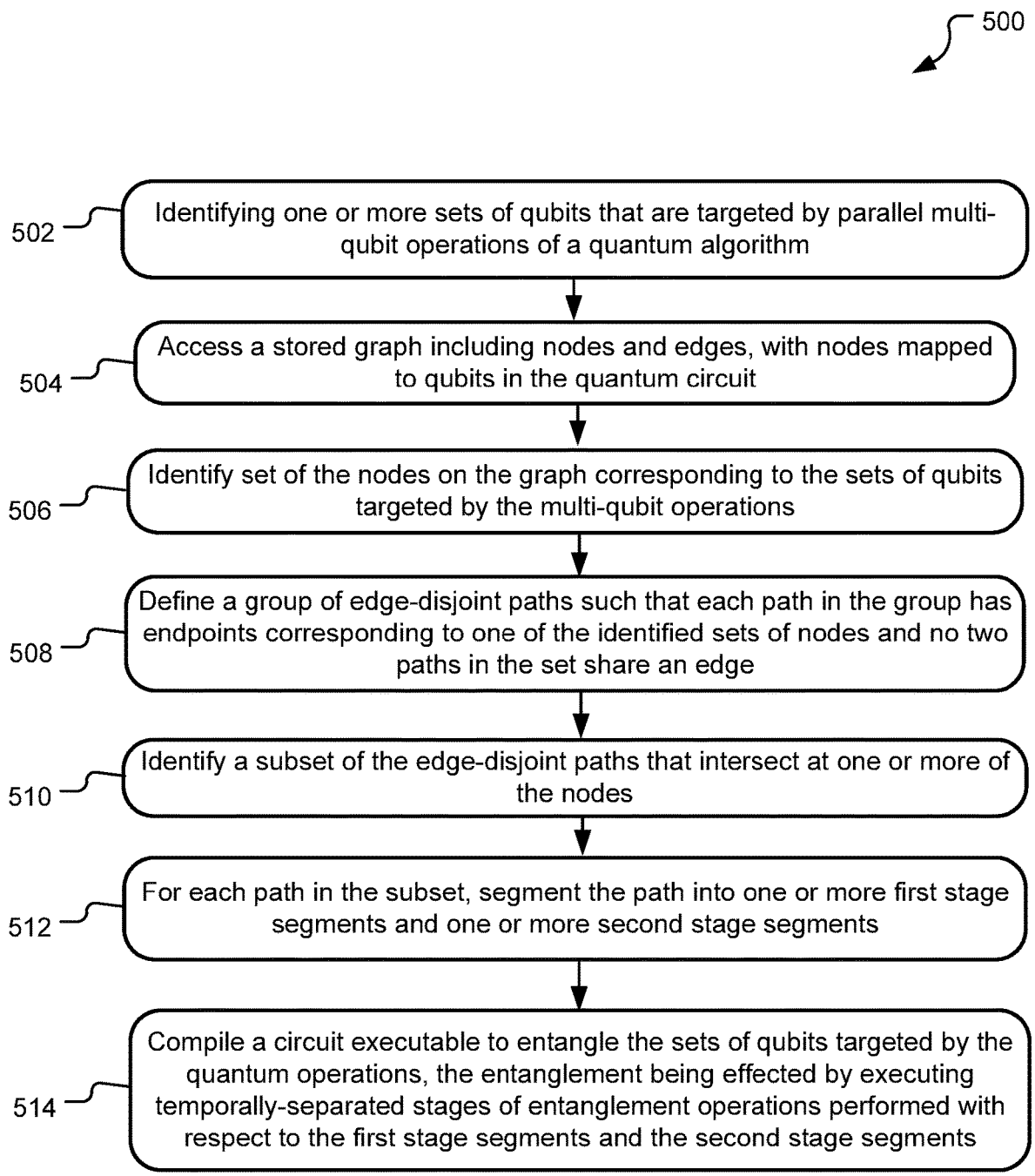
FIG. 5 illustrates example operations for implementing parallel, long-range multi-qubit operations in a quantum circuit that uses a surface code architecture for error correction.

FIG. 5 illustrates example operations 500 for implementing parallel, long-range multi-qubit operations in a quantum circuit that uses a surface code architecture for error correction. In one implementation, the operations 500 are performed by a controller, which may be either classical or quantum. An identifying operation 502 identifies one or more sets of qubits that are targeted by parallel multi-qubit operations requested by a quantum algorithm. An access operation 504 accesses a stored graph defined by nodes and edges, each of the nodes being mapped to qubits in the quantum circuit. Another identifying operation 506 identifies sets of nodes within the graph that correspond to the identified sets of qubits targeted by the parallel multi-qubit operations.

A path definition operation 508 defines a group of edge-disjoint paths such that each path in the group has endpoints corresponding to one of the identified sets of nodes and no two paths in the set share an edge. An intersection identification operation 510 identifies a subset of the edge-disjoint paths that intersect at one or more of the nodes, and a segmentation operation 512 segments each path in the identified in the intersection identification operation 510 into one or more first stage segments and one or more second stage segments. According to one implementation, the first stage segments are the second stage segments are defined such that no two of the first stage segments intersect one another and no two of the second stage segments intersect one another.

A circuit construction operation 514 constructs a circuit definition for a circuit that entangles the sets of qubits targeted by the multi-qubit operations. According to one implementation, the circuit achieves the entanglement of the sets of qubits by executing temporally-separated stages of entanglement operations on nearest-neighbor qubits. For example, the circuit is executable to perform a first set of entanglement operations to entangle qubits of each of the first stage segments and to perform a second set of entanglement operations to entangle qubits of each of the second stage segments. Outputs of the circuit construction operation 514 (e.g., the circuit definition) are usable to construct a quantum circuit in a quantum computer that performs the parallel multi-qubit operations.

Figure 6:
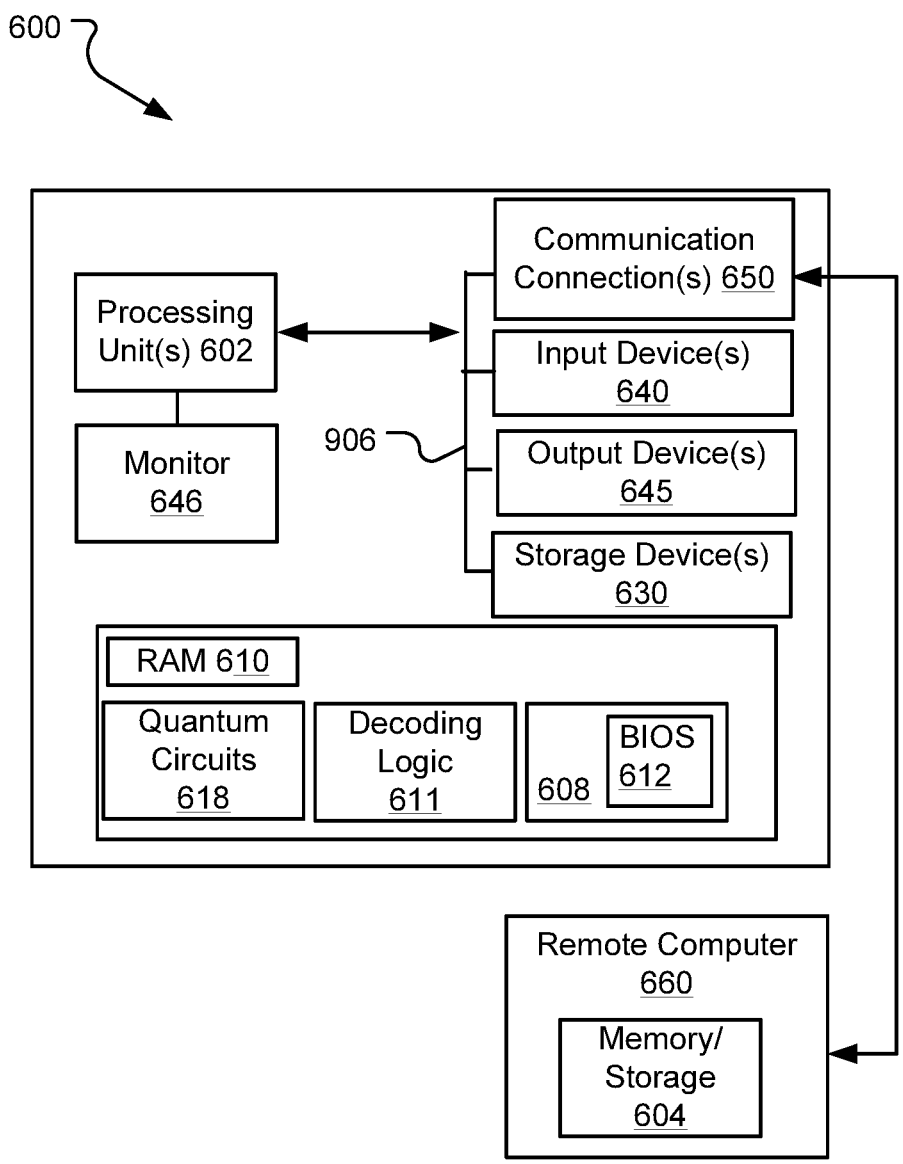
FIG. 6 illustrates an exemplary computing environment suitable for implementing aspects of the disclosed technology.

FIG. 6 and the following discussion are intended to provide a brief, general description of an exemplary computing environment in which the disclosed technology may be implemented. Although not required, the disclosed technology is described in the general context of computer executable instructions, such as program modules, being executed by a personal computer (PC). Generally, program modules include routines, programs, objects, components, data structures, etc., that perform particular tasks or implement particular abstract data types. Moreover, the disclosed technology may be implemented with other computer system configurations, including hand held devices, multiprocessor systems, microprocessor-based or programmable consumer electronics, network PCs, minicomputers, mainframe computers, and the like. The disclosed technology may also be practiced in distributed computing environments where tasks are performed by remote processing devices that are linked through a communications network. In a distributed computing environment, program modules may be located in both local and remote memory storage devices. Typically, a classical computing environment is coupled to a quantum computing environment, but a quantum computing environment is not shown in FIG. 12.

With reference to FIG. 6, an exemplary system for implementing the disclosed technology includes a general purpose computing device in the form of an exemplary conventional PC 600. The conventional PC 600 may include a variety of tangible computer-readable storage media and intangible computer-readable communication signals. Tangible computer-readable storage can be embodied by any available media that can be accessed by the conventional PC 600 and includes both volatile and nonvolatile storage media, removable and non-removable storage media. Tangible computer-readable storage media excludes intangible and transitory communications signals and includes volatile and nonvolatile, removable and non-removable storage media implemented in any method or technology for storage of information such as computer readable instructions, data structures, program modules or other data. Tangible computer-readable storage media includes, but is not limited to, RAM, ROM, EEPROM, flash memory or other memory technology, CDROM, digital versatile disks (DVD) or other optical disk storage, magnetic cassettes, magnetic tape, magnetic disk storage or other magnetic storage devices, or any other tangible medium which can be used to store the desired information, and which can be accessed by the conventional PC. In contrast to tangible computer-readable storage media, intangible computer-readable communication signals may embody computer readable instructions, data structures, program modules or other data resident in a modulated data signal, such as a carrier wave or other signal transport mechanism. The term "modulated data signal" means a signal that has one or more of its characteristics set or changed in such a manner as to encode information in the signal. By way of example, and not limitation, intangible communication signals include wired media such as a wired network or direct-wired connection, and wireless media such as acoustic, RF, infrared and other wireless media.

The conventional PC 600 includes one or more processing units 602, a system memory 604, and a system bus 606 that couples various system components including the system memory 604 to the one or more processing units 602. The system bus 606 may be any of several types of bus structures including a memory bus or memory controller, a peripheral bus, and a local bus using any of a variety of bus architectures. The exemplary system memory 604 includes read only memory (ROM) 608 and random access memory (RAM) 610. A basic input/output system (BIOS) 612, containing the basic routines that help with the transfer of information between elements within the PC 600, is stored in ROM 608.

In on implementation, the system memory 604 stores a classical controller 611n which includes one or more QECCs and logic for compiling quantum circuits (e.g., the edge-disjoint path identifier 116 and the path segmenter 118 of FIG. 1).

The exemplary PC 600 further includes one or more storage devices 630 such as a hard disk drive for reading from and writing to a hard disk, a magnetic disk drive for reading from or writing to a removable magnetic disk, and an optical disk drive for reading from or writing to a removable optical disk (such as a CD-ROM or other optical media). Such storage devices can be connected to the system bus 606 by a hard disk drive interface, a magnetic disk drive interface, and an optical drive interface, respectively. The drives and their associated computer readable media provide nonvolatile storage of computer-readable instructions, data structures, program modules, and other data for the PC 600. Other types of computer-readable media which can store data that is accessible by a PC, such as magnetic cassettes, flash memory cards, digital video disks, CDs, DVDs, RAMs, ROMs, and the like, may also be used in the exemplary operating environment.

A number of program modules may be stored in the storage devices 630 including an operating system, one or more application programs, other program modules, and program data. Control logic can be stored in the storage devices 630 as well as or in addition to the memory 604. A user may enter commands and information into the PC 600 through one or more input devices 640 such as a keyboard and a pointing device such as a mouse. Other input devices may include a digital camera, microphone, joystick, game pad, satellite dish, scanner, or the like. These and other input devices are often connected to the one or more processing units 602 through a serial port interface that is coupled to the system bus 606, but may be connected by other interfaces such as a parallel port, game port, or universal serial bus (USB). A monitor 646 or other type of display device is also connected to the system bus 606 via an interface, such as a video adapter. Other peripheral output devices 645, such as speakers and printers (not shown), may be included.

The PC 600 may operate in a networked environment using logical connections to one or more remote computers, such as a remote computer 660. In some examples, one or more network or communication connections 650 are included. The remote computer 660 may be another PC, a server, a router, a network PC, or a peer device or other common network node, and typically includes many or all of the elements described above relative to the PC 600, although only a memory storage device 662 has been illustrated in FIG. 6. The personal computer 600 and/or the remote computer 660 can be connected to a logical a local area network (LAN) and a wide area network (WAN). Such networking environments are commonplace in offices, enterprise wide computer networks, intranets, and the Internet.

When used in a LAN networking environment, the PC 600 is connected to the LAN through a network interface. When used in a WAN networking environment, the PC 600 typically includes a modem or other means for establishing communications over the WAN, such as the Internet. In a networked environment, program modules depicted relative to the personal computer 600, or portions thereof, may be stored in the remote memory storage device or other locations on the LAN or WAN. The network connections shown are exemplary, and other means of establishing a communications link between the computers may be used.

A method disclosed herein provides for defining a graph including nodes connected by edges, with the nodes being mapped to qubits in a quantum device. The method further provides for identifying sets of nodes on the graph corresponding to sets of qubits targeted by multi-qubit operations in a quantum algorithm and defining a group of edge-disjoint paths with each path in the group being defined along one or more edges and nodes and including one of the identified sets of nodes, and the group of edge-disjoint paths being defined such that no two of the paths in the group share an edge. The method further provides for performing a set of operations for each defined path in the set that are effective to entangle the qubits corresponding to the identified set of nodes that are included in the path, and performing the set of multi-qubit operations on the entangled sets of the qubits.

An example method according to any preceding method provides for identifying a subset of the paths within the defined set of edge-disjoint paths that intersect with one another at one or more nodes. For each path in the identified subset of paths, the path is segmented into one or more first stage segments and one or more second stage segments with the first stage segments and the second stage segments being defined such that no two of first stage segments intersect one another and no two of the second stage segments intersect one another. Entanglement operations are performed in association with the first stage segments at a different point in time than entanglement operations associated with the second stage segment.

Another example method of any preceding method further provides for performing a first set of operations to entangle qubits corresponding to each respective one of the first stage segments and, at a subsequent time, performing a second set of operations to entangle qubits corresponding to each respective one of the second stage segments.

In still yet another example method of any preceding method, performing the first set of operations to entangle the qubits of each respective one of the first stage segments further comprises: defining even and odd edges in the first stage segment; for qubits corresponding to each even edge in the first stage segment, performing a joint measurement; and for qubits corresponding to each odd edge in the first stage segment, performing a joint measurement.

In still another example method of any preceding method, performing the first set of operations to entangle the qubits of each respective one of the second stage segments further comprises: defining even and odd edges in the second stage segment; for qubits corresponding to each even edge in the second stage segment, performing a joint measurement; and for qubits corresponding to each odd edge in the second stage segment, performing a joint measurement.

In yet another example method of any preceding method, the qubits in the quantum device are logical qubits implemented in a surface code that is built from physical qubits.

In still another example method of any preceding method, performing the set of multi-qubit operations further comprises simultaneously performing some or all of the multi-qubit operations.

An example quantum computing system includes a quantum device that executes circuit definitions to effect parallel multi-qubit operations specified by a quantum algorithm. The system further includes a controller stored in memory and executable to: access a graph including nodes mapped to the qubits in the quantum device, the nodes of the graph being connected by edges; identify sets of nodes on the graph corresponding to sets of qubits targeted by the parallel multi-qubit operations; and define a group of edge-disjoint paths, where each path in the group is defined along one or more edges and nodes and includes one of the identified sets of nodes. The group of edge-disjoint paths is defined such that no two of the paths in the set share an edge. The controller is further executable to compile a circuit for execution by the quantum device that may, when executed, entangle the qubits corresponding to the identified set of nodes included in each defined path in the group of edge-disjoint paths and to perform the parallel multi-qubit operations.

In an example quantum system of any preceding system, the controller is further executable to: identify a subset of the paths within the group that intersect at one or more nodes and, for each path in the identified subset of paths, segment the path into one or more first stage segments and one or more second stage segments. The first stage segments and the second stage segments are defined such that no two of first stage segments intersect one another and no two of the second stage segments intersect one another. The compiled circuit is further executable to effect entanglement operations associated with the first stage segments at a different point in time than entanglement operations associated with the second stage segment.

In another example quantum system of any quantum computing system, the controller is further executable to generate a first circuit definition for a first circuit executable to effect a first set of operations to entangle qubits corresponding to each respective one of the first stage segments and to generate a second circuit definition for a second circuit executable to effect a second set of operations to entangle qubits corresponding to each respective one of the first stage segments.

In yet another example quantum system of any preceding quantum system, even and odd edges are defined with respect to each one of the first stage segments and the first circuit is further executable to: perform a joint measurement on qubits corresponding to each of the even edges within the first stage segments; and perform a joint measurement on qubits corresponding to each of the odd edges within the first stage segments.

In yet still another example quantum computing system of any computing system, even and odd edges are defined with respect to each one of the second stage segments. The second circuit is further executable to perform a joint measurement on qubits corresponding to each of the even edges in the second stage segments and perform a joint measurement on qubits corresponding to each of the odd edges within the second stage segments.

In another example quantum system of any preceding quantum system, the qubits in the quantum circuit are logical qubits implemented in a surface code built from physical qubits.

In another example quantum system of any preceding system, the circuit is further executable to simultaneously execute some or all of the parallel multi-qubit operations.

An example tangible computer-readable storage media disclosed herein encodes computer-executable instructions for executing a computer process, where the computer process comprises: defining a graph including nodes mapped to qubits in a quantum device, the nodes of the graph being connected by edges; identifying sets of nodes on the graph corresponding to sets of qubits targeted by multi-qubit operations in a quantum algorithm; and defining a group of edge-disjoint paths, where each path in the group is defined along one or more edges and nodes and includes one of the identified sets of nodes. The group of edge-disjoint paths is defined such that no two of the paths in the group share an edge, and the computer process further comprises performing a set of operations with respect to each defined path, the set of operations being effective to entangle the qubits corresponding to the identified set of nodes that are included in the path. The set of multi-qubit operations is then performed on the entangled sets of the qubits.

In an example tangible computer-readable storage media of any preceding computer-readable storage media, the computer process further comprises: identifying a subset of the paths within the group that intersect with one another at one or more nodes and, for each path in the identified subset of paths, segmenting the path into one or more first stage segments and one or more second stage segments. The first stage segments and the second stage segments are defined such that no two of first stage segments intersect one another and no two of the second stage segments intersect one another. The process further provides for performing entanglement operations associated with the first stage segments at a different point in time than entanglement operations associated with the second stage segment.

In yet still another example tangible computer-readable storage media of any preceding computer-readable storage media, the computer process further comprises performing a first set of operations to entangle qubits corresponding to each respective one of the first stage segments and, at a subsequent time, performing a second set of operations to entangle qubits corresponding to each respective one of the second stage segments.

In another example tangible computer-readable storage media of any preceding computer-readable storage media, performing the entanglement operations associated with the first stage segments further comprises: defining even and odd edges in each of the first stage segments and performing a joint measurement for qubits corresponding to each even edge in one of the first stage segments. The process further comprises next performing a joint measurement for qubits corresponding to each odd edge in the one of first stage segments.

In yet still another example tangible computer-readable storage media of any preceding computer-readable storage media, the computer process further comprises defining even and odd edges in the second stage segment; performing a joint measurement on each set of qubits corresponding to an even edge in one of the second state segments; and performing a joint measurement on each set of qubits corresponding to an odd edge in one of the second stage segments.

In yet still another example tangible computer-readable storage media of any preceding computer-readable storage media, the qubits in the quantum circuit are logical qubits implemented in a surface code built from physical qubits.

An example system disclosed herein includes a means for defining a graph including nodes mapped to qubits in a quantum device, where the nodes are connected to each other by edges; a means for identifying sets of nodes on the graph corresponding to sets of qubits targeted by multi-qubit operations in a quantum algorithm; and a means for defining a group of edge-disjoint paths, where each path in the group is defined along one or more edges and nodes and includes one of the identified sets of nodes. The group of edge-disjoint paths is defined such that no two of the paths in the group share an edge, and the system further includes a means for performing a set of operations with respect to each defined path, the set of operations being effective to entangle the qubits corresponding to the identified set of nodes that are included in the path; and a means for performing the set of multi-qubit operations on the entangled sets of the qubits.

The above specification, examples, and data provide a complete description of the structure and use of exemplary implementations. Since many implementations can be made without departing from the spirit and scope of the claimed invention, the claims hereinafter appended define the invention. Furthermore, structural features of the different examples may be combined in yet another implementation without departing from the recited claims. The above specification, examples, and data provide a complete description of the structure and use of exemplary implementations. Since many implementations can be made without departing from the spirit and scope of the claimed invention, the claims hereinafter appended define the invention. Furthermore, structural features of the different examples may be combined in yet another implementation without departing from the recited claims.

What is claimed is:

1. A method comprising:
defining a graph including nodes mapped to qubits in a quantum device, the nodes being connected to each other by edges;
identifying sets of nodes on the graph corresponding to sets of qubits targeted by multi-qubit operations in a quantum algorithm;
defining a group of edge-disjoint paths, each path in the group being defined along one or more edges and nodes and including one of the identified sets of nodes, the group of edge-disjoint paths being defined such that no two of the paths in the group share an edge;
for each defined path, performing a set of operations to entangle the qubits corresponding to the identified set of nodes that are included in the path; and
performing the set of multi-qubit operations on the entangled sets of the qubits.

2. The method of claim 1, further comprising:
within the defined set of edge-disjoint paths, identifying a subset of the paths that intersect with one another at one or more nodes;
for each path in the identified subset of paths, segmenting the path into one or more first stage segments and one or more second stage segments, the first stage segments and the second stage segments being defined such that no two of first stage segments intersect one another and no two of the second stage segments intersect one another; and
performing entanglement operations associated with the first stage segments at a different point in time than entanglement operations associated with the second stage segment.

3. The method of claim 2, further comprising:
performing a first set of operations to entangle qubits corresponding to each respective one of the first stage segments;
at a subsequent time, performing a second set of operations to entangle qubits corresponding to each respective one of the second stage segments.

4. The method of claim 3, wherein performing the first set of operations to entangle the qubits of each respective one of the first stage segments further comprises:
defining even and odd edges in the first stage segment;
for qubits corresponding to each even edge in the first stage segment, performing a joint measurement; and
for qubits corresponding to each odd edge in the first stage segment, performing a joint measurement.

5. The method of claim 3, wherein performing the first set of operations to entangle the qubits of each respective one of the second stage segments further comprises:
defining even and odd edges in the second stage segment;
for qubits corresponding to each even edge in the second stage segment, performing a joint measurement;
for qubits corresponding to each odd edge in the second stage segment, performing a joint measurement.

6. The method of claim 1, wherein the qubits in the quantum device are logical qubits implemented in a surface code that is built from physical qubits.

7. The method of claim 1, wherein performing the set of multi-qubit operations further comprises:
simultaneously performing some or all of the multi-qubit operations.

8. A quantum computing system comprising:
a quantum device that executes circuit definitions to effect parallel multi-qubit operations specified by a quantum algorithm; and
a controller stored in memory and executable to:
access a graph including nodes mapped to the qubits in the quantum device, the nodes of the graph being connected by edges;
identify sets of nodes on the graph corresponding to sets of qubits targeted by the parallel multi-qubit operations;
define a group of edge-disjoint paths, each path in the group being defined along one or more edges and nodes and including one of the identified sets of nodes, the group of edge-disjoint paths being defined such that no two of the paths in the set share an edge;
compile a circuit for execution by the quantum device, the circuit being executable to entangle the qubits corresponding to the identified set of nodes included in each defined path in the group of edge-disjoint paths and to perform the parallel multi-qubit operations.

9. The quantum computing system of claim 8, wherein the controller is further executable to:
identify a subset of the paths within the group that intersect at one or more nodes;
for each path in the identified subset of paths, segment the path into one or more first stage segments and one or more second stage segments, the first stage segments and the second stage segments being defined such that no two of first stage segments intersect one another and no two of the second stage segments intersect one another,
wherein the compiled circuit is further executable to effect entanglement operations associated with the first stage segments at a different point in time than entanglement operations associated with the second stage segment.

10. The quantum computing system of claim 9, wherein the controller is further executable to:
generate a first circuit definition for a first circuit executable to effect a first set of operations to entangle qubits corresponding to each respective one of the first stage segments;
generate a second circuit definition for a second circuit executable to effect a second set of operations to entangle qubits corresponding to each respective one of the first stage segments.

11. The quantum computing system of claim 10, wherein even and odd edges are defined with respect to each one of the first stage segments and the first circuit is further executable to:
perform a joint measurement on qubits corresponding to each of the even edges within the first stage segments; and
perform a joint measurement on qubits corresponding to each of the odd edges within the first stage segments.

12. The quantum computing system of claim 10, wherein even and odd edges are defined with respect to each one of the second stage segments and the second circuit is further executable to:
perform a joint measurement on qubits corresponding to each of the even edges in the second stage segments; and
perform a joint measurement on qubits corresponding to each of the odd edges within the second stage segments.

13. The quantum computing system of claim 8, wherein the qubits in the quantum circuit are logical qubits implemented in a surface code built from physical qubits.

14. The quantum computing system of claim 8, wherein the circuit is further executable to simultaneously execute some or all of the parallel multi-qubit operations.

15. A tangible computer-readable storage medium having instructions stored thereon, wherein the instructions when executed by a processor cause the processor to:
define a graph including nodes mapped to qubits in a quantum device, the nodes of the graph being connected by edges;
identify sets of nodes on the graph corresponding to sets of qubits targeted by multi-qubit operations in a quantum algorithm;
define a group of edge-disjoint paths, each path in the group being defined along one or more edges and nodes and including one of the identified sets of nodes, the group of edge-disjoint paths being defined such that no two of the paths in the group share an edge;
for each defined path, perform a set of operations to entangle the qubits corresponding to the identified set of nodes that are included in the path; and
perform the set of multi-qubit operations on the entangled sets of the qubits.

16. The tangible computer-readable storage media of claim 15, wherein the instructions further cause the processor to:
identify a subset of the paths within the group that intersect with one another at one or more nodes;
for each path in the identified subset of paths, segment the path into one or more first stage segments and one or more second stage segments, the first stage segments and the second stage segments being defined such that no two of first stage segments intersect one another and no two of the second stage segments intersect one another; and
perform entanglement operations associated with the first stage segments at a different point in time than entanglement operations associated with the second stage segment.

17. The tangible computer-readable storage media of claim 16, wherein the instructions further cause the processor to:
performing a first set of operations to entangle qubits corresponding to each respective one of the first stage segments;
at a subsequent time, performing a second set of operations to entangle qubits corresponding to each respective one of the second stage segments.

18. The tangible computer-readable storage media of claim 16, wherein the entanglement operations associated with the first stage segments further comprise:
defining even and odd edges in each of the first stage segments;
for qubits corresponding to each even edge in one of the first stage segments, performing a joint measurement; and
for qubits corresponding to each odd edge in the one of first stage segments, performing a joint measurement.

19. The tangible computer-readable storage media of claim 16, wherein the entanglement operations associated with the second stage segments further comprise:
defining even and odd edges in the second stage segment;
for qubits corresponding to each even edge in one of the second stage segment, performing a joint measurement;
for qubits corresponding to each odd edge in one of the second stage segment, performing a joint measurement.

20. The tangible computer-readable storage media of claim 15, wherein the qubits in the quantum circuit are logical qubits implemented in a surface code built from physical qubits.

* * * * *